United States Patent [19]

Cook

[11] Patent Number: 4,870,353
[45] Date of Patent: Sep. 26, 1989

[54] PRE-LOADED COMPRESSION SPRING ASSEMBLY

[75] Inventor: Stephen J. Cook, Loveland, Colo.

[73] Assignee: Hewlett-Packard, Palo Alto, Calif.

[21] Appl. No.: 139,418

[22] Filed: Dec. 30, 1987

[51] Int. Cl.⁴ .......................... G01R 1/04; G01R 1/02
[52] U.S. Cl. .............................. 324/158 F; 324/73 PC
[58] Field of Search ........... 324/73 PC, 158 P, 158 F; 267/170, 174, 290, 275

[56] References Cited

U.S. PATENT DOCUMENTS

| | | | |
|---|---|---|---|
| 1,404,464 | 1/1922 | Meyer | 267/290 |
| 1,453,471 | 5/1923 | Le Tarte | 267/174 |
| 1,890,822 | 12/1932 | Murray | 267/174 |
| 2,621,887 | 12/1952 | Todd | 267/174 |
| 4,344,033 | 8/1982 | Stowers et al. | 324/73 PC |
| 4,463,560 | 8/1984 | Greenleaf et al. | 267/174 |
| 4,701,700 | 10/1987 | Jenkins . | |
| 4,739,257 | 4/1988 | Jenson et al. | 324/158 F |

FOREIGN PATENT DOCUMENTS 1305468  4/1987  U.S.S.R. ............................. 267/174

OTHER PUBLICATIONS

Southco, Inc. "Southco Fasteners Handbook 35," 1986, p. LL-6.

Primary Examiner—Reinhard J. Eisenzopf
Assistant Examiner—W. Burns
Attorney, Agent, or Firm—Jeffery B. Fromm

[57] ABSTRACT

A pre-loaded compression spring assembly is described which preferably includes a compression spring, a base plate to support one end of the spring, and a flexible retention member which extends over the opposite end of the spring and which is adapted to retain the spring in a pre-loaded condition on the base plate. The spring assembly is compressed when force is applied to the upper end of the spring. The spring assembly has a variety of uses, including for example use in circuit board testing apparatus.

12 Claims, 6 Drawing Sheets

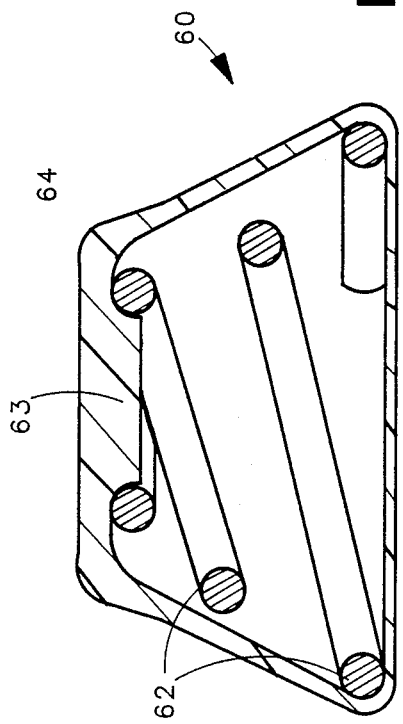
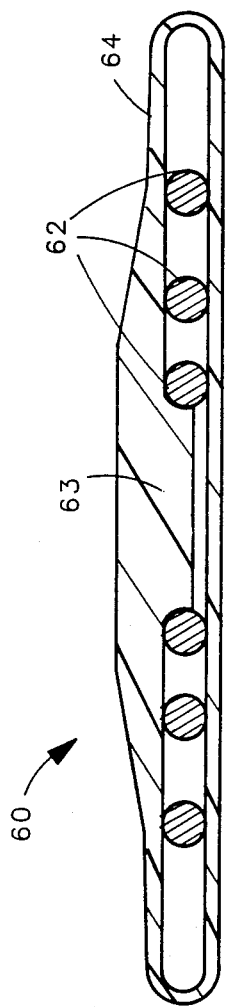

PRE-LOADED COMPRESSION SPRING ASSEMBLY

FIELD OF THE INVENTION

This invention relates to spring assemblies. More particularly, this invention relates to pre-loaded compression spring assemblies. In another aspect this invention relates to pre-loaded compression spring assemblies which are useful, for example, in testing fixtures for circuit boards.

BACKGROUND OF THE INVENTION

There is a need for pre-loaded compression springs in many mechanical devices or equipment in many different fields. Wherever a mechanism or component must be held in an accurate position against an opposing force (e.g., gravity, air pressure, a spring, etc.) there is a potential need for a pre-loaded compression spring. In some situations it may be posible to use fixed stops to meet requirements, but in many situations this is either impossible or impractical.

A conventional spring is often used to press an assembly against a stop in order to locate the assembly accurately. However, in order to produce adequate spring force under compression, it is often necessary for the spring to be quite long in its free standing state. Thus, in order to effectively use such a spring for this purpose, the design of the assembly must be such that the spring does not produce mechanical interference in the setting in which if is used.

In some situations it is necessary for the spring to be pre-loaded in compression to enable it to fit into the space available. Previously proposed pre-loaded springs have not been satisfactory for all purposes.

Conventional pre-loaded spring designs typically include a helical compression spring constrained to a pre-loaded height by means of a solid rod or post. The means for pre-loading the springs usually consists of parts which extend through the ends of the assembly and have nuts, circlips, or other mechanical means for securing them on the outside. It is difficult and time-consuming to assembly and disassemble such devices, especially since the spring pre-load must be overcome before the pre-loading means can be assembled or disassembled.

Because of the design, the length of height of the prior assembly remains the same when the spring is compressed further. As a result, there is a certain amount of space which is required in order to permit use of such devices. Although it is sometimes possible to place one end of such a device into a counter-bored hole to reduce the effective height of the device, this is not always possible or practical. For example, in some situations there is insufficient space available to permit counter-boring. Also, this procedure adds cost and may be complicated to effect.

A pre-loaded spring device of the type described above, as used in circuit board testing apparatus, is described in U.S. Pat. No. 4,701,700. Because such device has a finite height, thered are inherent limitations associated with the use of such device. For example, the degree of compression of the spring is limited by the effective length of the screw fastener. Also, such device penetrates one of the plate members which supports the device.

There has not heretofore been provided a pre-loaded compression spring assembly which produces significant force at a pre-loaded height, has fairly long travel, has a short overall height when fully compressed, requires minimal area, and is easy to mount into a mechanical assembly.

SUMMARY OF THE PRESENT INVENTION

In accordance with the present invention there is provided a pre-loaded compression spring assembly which is unique in design and which avoids the problems associated with prior pre-loaded spring designs.

In one embodiment the pre-loaded compression spring assembly comprises:
(a) a compression spring having upper and lower ends;
(b) a base plate adapted to support the lower end of the spring; and
(c) a flexible retention member (e.g., a plastic strap) extending over the upper end of the spring and being adapted to retain the spring in a pre-loaded condition on the base plate.

The entire spring assembly of the invention is adapted to be compressed when force is applied against the top of the assembly. In other words, the spring assembly of this invention is not limited to a fixed height during use. This is a very significant advantage.

Furthermore, the spring assembly of this invention can be used as a free standing unit. It is not necessary to bore holes in a substrate to mount the spring assembly, nor is it necessary to use mechanical fasteners to mount the assembly. As a result, the spring assembly may be easily positioned at any desired location on a substrate, and it can be easily re-positioned, as desired.

Also, because of the design of the spring assembly, it occupies only a very small amount of space, and it can be used in many applications where conventional pre-loaded springs cannot be used. When the spring assembly of this invention is used, it is compressible to a very short height without penetrating either of the substrates between which it is used.

Other advantages of the spring assembly of the invention will be apparent fromt he following detailed description.

BRIEF DESCRIPTION OF THE DRAWINGS

The invention is described in more detail hereinafter with reference to the accompanying drawings, wherein like reference characters refer to the same parts throughout the several views and in which:

FIGS. 7A and 7B are cross-sectional view of yet another embodiment of spring assembly of the invention.

DETAILED DESCRIPTION OF THE INVENTION

Figure 1:
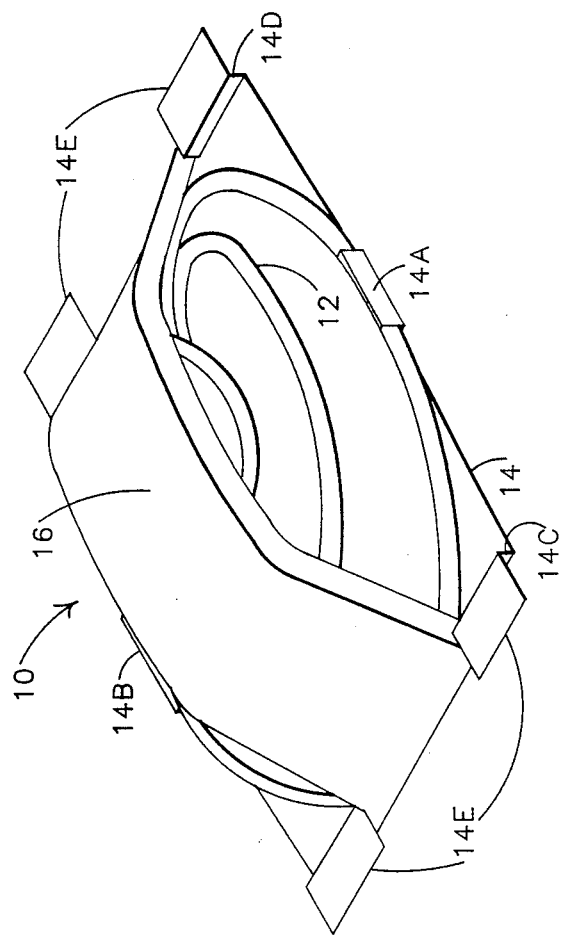
FIG. 1 is a perspective view of one embodiment of pre-loaded compression spring assembly of the invention.
Figure 2:
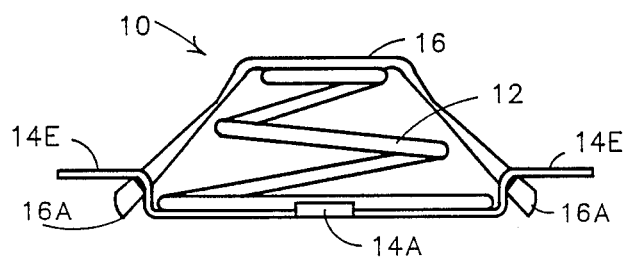
FIG. 2 is a side elevational view of the spring assembly shown in FIG. 1.
Figure 3:
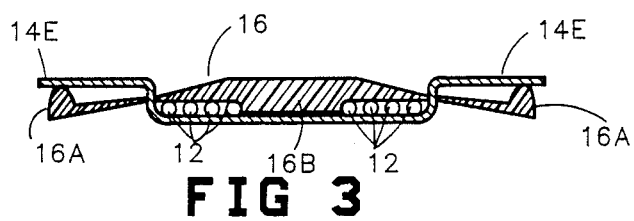
FIG. 3 is a cross-sectional view of the spring assembly of FIG. 2 in a totally compressed condition.

In FIGS. 1-3 there is illustrated a preferred embodiment of pre-loaded compression spring assembly 10 of the invention comprising conical compression spring 12, base plate 14, and flexible retention member 16. The compression spring 12 is a wound wire spring which may be formed of any desired type and size of material so long as it is resilient and compressible. Preferably it is capable of being repeatedly compressed without breaking or losing its resilience. Springs of this type are well known in the art and are commercially available from many manufacturers. The number of coils present in the spring may vary, as desired. Similarly, the height and diameter of the spring may be varied.

The base plate 14 preferably has a flat or planar central portion, as illustrated, on which the lower end of the spring 12 is supported.

It is also preferable to include stop means for constraining the lower end of the spring laterally (i.e., in both the x and y directions) when the spring is compressed. This is effected by means of stops 14A and 14B on opposite sides of base member 14 and by walls 14C and 14D on opposite end of base 14.

Extending outwardly from the wall members are fingers 14E which are separated from each other, as illustrated. The length of the fingers 14E may vary. They are adapted to capture the ends of the retention member 16.

Retention member 16 preferably comprises a flexible plastic strap having ears 16A projecting outwardly from each end thereof. The ears 16A extend under the fingers 14E, as illustrated, where they are captured. This prevents the retention member 16 from separating from the base.

The length of the retention member 16 may vary, depending upon the height of the spring 12 and the desired amount of pre-loaded compression for the spring in the assembly. The retention member extends upwardly from the base, over the top of the spring, and downwardly to the opposite end of the base, as shown. Thus, the spring is fully retained on the base in the desired pre-load condition.

FIG. 3 illustrates the spring assembly 10 in its fully compressed condition. As illustrated, the conical spring 12 is compressed in a manner such that all the coils are supported on the top of the base in side-by-side fashion. This means that the height of the compressed assembly is very short. The ends of the retention member are forced outwardly when the assembly is compressed, but the ears 16A do not escape from under fingers 14E.

Figure 4:
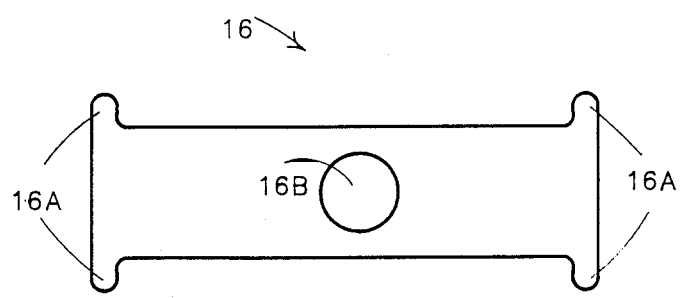
FIG. 4 is a bottom view of a preferred embodiment of retention member useful in the spring assembly of this invention.

Preferably retention member 16 includes a boss or projection 16B on its bottom surface at the mid-point thereof. This is also illustrated in FIG. 4. This projection is adapted to rest or seat within the uppermost coil of the spring 12. This assists in preventing the top of the spring from slipping out from under the retention member in the assembly.

Figure 5A:
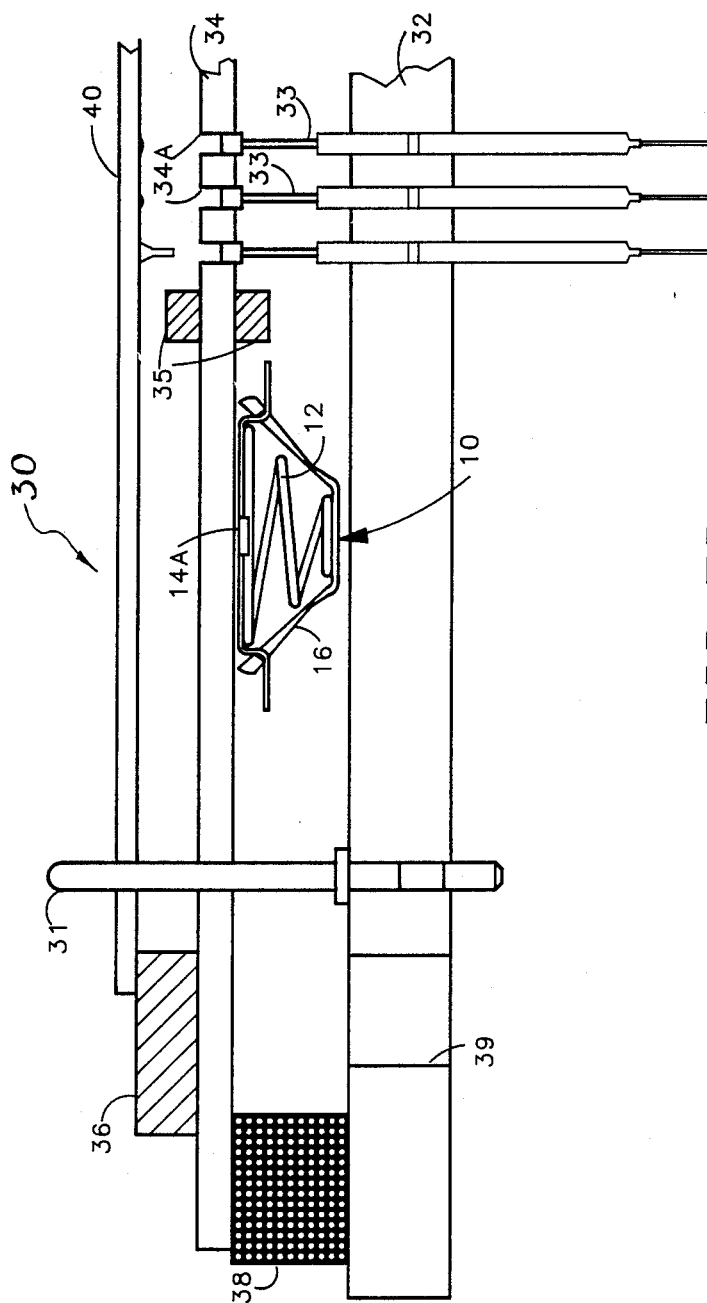
FIGS. 5A and 5B illustrate the use of a preferred embodiment of spring assembly of the invention in circuit board testing apparatus.
Figure 5B:
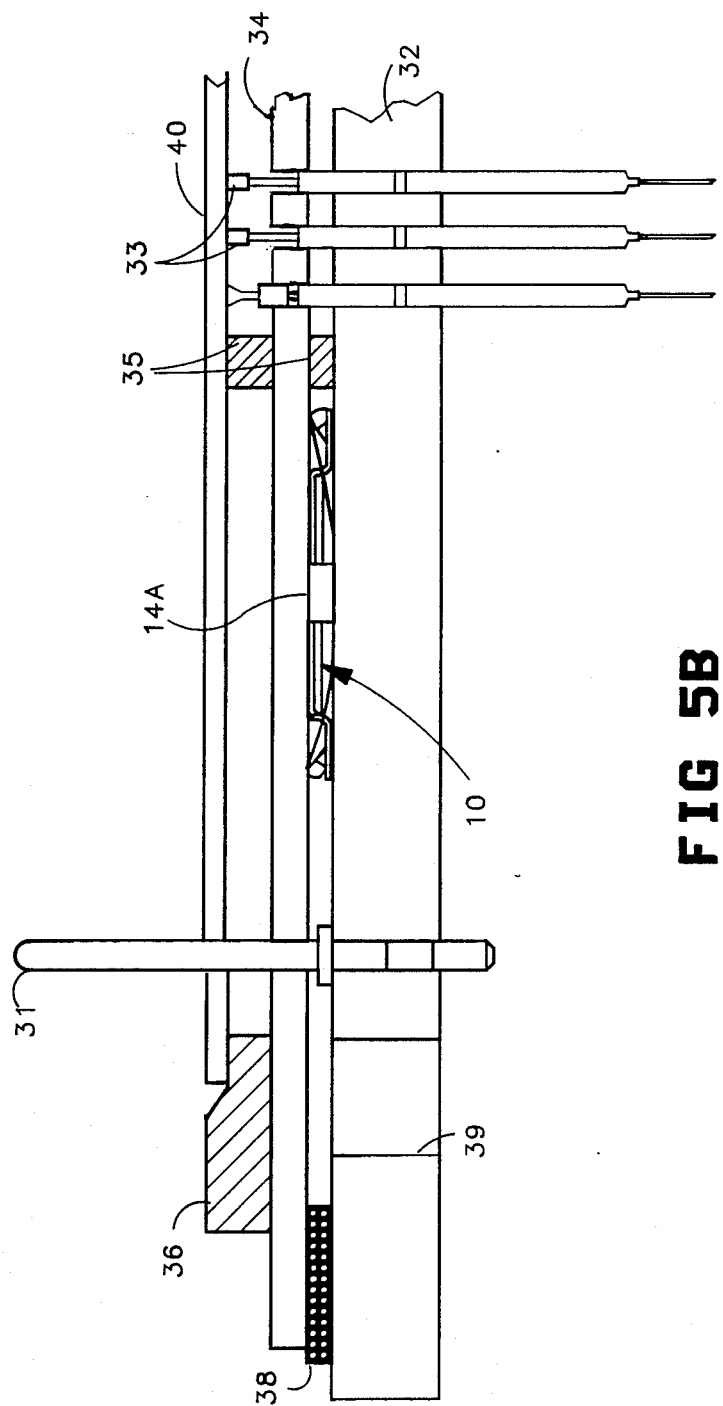

FIGS. 5A and 5B illustrate the use of the spring assembly 10 in a conventional circuit board testing fixture 30. The fixture includes plate members 32 and 34 which are spaced apart from each other in generally parallel fashion. Test probes 33 extend upwardly fromo plate 32 toward plate 34 which includes apertures 34A. The probes can extend through these apertures to operatively contact the appropriate points on the circuit board 40 when plate 34 and the circuit board are drawn downwardly towards plate 32 when a vacuum is applied between the plates.

Opening 39 in plate 32 enables the vacuum to be applied between the two plates. Tooling pins 31 extend through the plates and appropriate openings in the circuit board in order to maintain proper alignment of these items during testing. Circuit board gasket 36 separates the edges of the circuit board 40 and upper plate 34. Highly compressible gasket 38 separates the edges of plate 34 from plate 32. Stops 35 on the upper and lower surfaces of plate 34 limit the vertical travel of the upper plate and the circuit board.

Spring assembly 10 is shown positioned between plates 32 and 34. The spring assemblies may be positioned at any desired locations between the plates and may be retained onto either plate, for example, by means of a layer of adhesive, or by means of a double-sided adhesive tape, etc. The spring assemblies can also be easily re-positioned if necessary. The spring assemblies do not penetrate either plate, and there is no need to permanently mount the spring assemblies with mechanical fasteners.

FIG. 5B illustrates the condition of the plates and the spring assembly after vacuum has been applied between the plates. The probes 33 make operative contact with the circuit board, and the gaskets are compressed around the edges of the circuit board and the plates. The spring assembly 10 is shown in its fully compressed condition between the plates 32 and 34, without penetrating either plate and without interfering in any way with the vacuum created between the plates.

In many cases the plate 34 is larger than the circuit board 40 to betested. Because of this, when the vacuum presses the circuit board against the test probes of the vacuum pressure is also exerted against the top surface of the support plate in the area outside the circuit board gasket. When the circuit board first comes into contact with the test probes, pre-loaded springs within the test probes prevent the circuit board from descending farther until vacuum pressure increases to a level sufficient to overcome the force exerted by the pre-loaded springs in the test probes. At the same time, the increasing vacuum pressure on the support plate outside the circuit board perimeter tends to press the support plate down, thus breaking the gasket seal between the circuit board and the support plate. This phenomenon is known as "pop-off". When this happens, because the seal is broken, the circuit board can no longer be pressed farther down against the test probes.

To prevent "pop-off" from occurring, an additional spring force is required beneath the area of the support plate outside the circuit board perimeter to resist vacuum pressure and thereby prevent the circuit board from leaving the support plate. This spring force must be exerted before the test probes make contact with the circuit board. This enables the circuit board to form a good seal against the support plate gasket and prevents "pop-off".

Although it is not necessary for the spring to be pre-loaded, it is preferable. For example, if the spring is not pre-loaded, the tooling pins necessary to align the circuit board with the plate must be very long in order to reach the circuit board above the test probes. This can create additional problems.

Also, to prevent the test probes from extending very far above the surface of the fixture plate 32, the circuit board must be permitted to move as close as possible to the plate. To allow this, any pre-loaded springs used must compress to as short a height as possible. It is not desirable to machine holes or openings into one or the other of the plates to accommodate a prior art pre-loaded spring design. For one thing, it is costly to machine such openings. Also, once the openings are provided in a plate, it is not possible to re-position the pre-loaded springs without creating new openings and filling old openings. Finally, if an opening is cut through the plate, means for sealing against vacuum loss may be required.

The pre-loaded spring assemblies of the present invention can be positioned in any desired location in circuit board testing apparatus without having to create openings in either plate. The assemblies can also be easily re-positioned, as desired. No permanent mounting is required. A layer of adhesive or adhesive tape may be used to mount or retain the assembly in the desired location. Furthermore, the spring assembly may be compressed to a very thin profile without having to penetrate either plate and without interfering with the vacuum action in the testing apparatus.

Figure 6A:
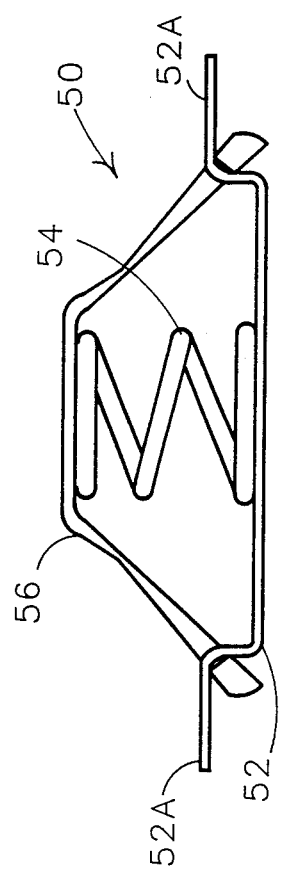
FIGS. 6A and 6B are side elevational views of another embodiment of a spring assembly of the invention.
Figure 6B:
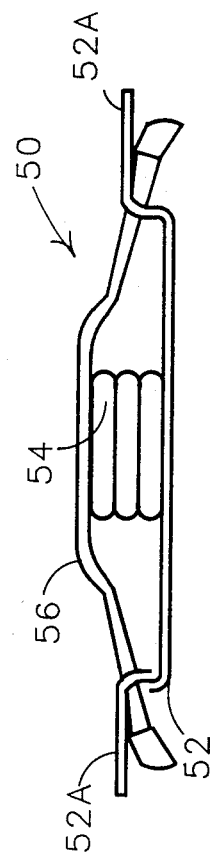

In FIGS. 6A and 6B there is illustrated another embodiment of pre-loaded compression spring assembly 50 of the invention comprising base plate 52, helical spring 54, and retention member 56. The lower end of the spring member is positioned on the base plate and the retention member extends over the upper end of the spring.

The ends of the retention member are captured by opposite ends 52A of the base plate (for example, in the manner illustrated and described above in connection with FIGS. 1–4). Although a helical spring is not compressible to as short a height as a conical spring, the other advantages of the spring assemblies of the invention are exhibited.

In FIGS. 7A and 7B there is illustrated another embodiment of pre-loaded compression spring assembly 60 of the invention comprising compression spring 62 and retention member 64. As illustrated, the retention member extends around and over the spring and retains the spring in a desired pre-loaded condition. When force is applied to the top of the assembly to compress it, the thin profile of the assembly is as shown in FIG. 7B.

If desired, the retention member may be an endless strap or it may have two ends which are secured together or secured to the spring member itself. Preferably the retention member includes a boss or projection 63 which engages or rests within the top coil of the spring. This prevents the retention member from slipping off the spring. The retention member may also include a boss or projection which engages the lower coil of the spring to prevent the retention member from slipping off the lower end of the spring.

The retention members used in the pre-loaded spring assemblies of the invention are flexible and preferably nonelastic. They should be durable and capable of flexing without breaking even after repeated compression cycles of the spring assembly. Particularly preferred retention members comprise nylon 6,6 (a well known plastic which is commercially available). Other plastic materials may also be used (e.g., polypropylene, acetel, etc.) depending upon the degree of durability required.

The base plate shown and described herein is typically made of metal although it could comprise plastic. Preferably it is thin (e.g., 0.010 inch) so that the spring assembly can be compressed to a very short height if necessary.

The manner in which the ends of the retention member are captured by the base plate may vary. For example, the ends of the base plate may include slots which are adapted to capture enlarged ends of the retention member. The ends of the retention member could also include hooks which are connectable to the ends of the base plate. Alternatively, hooks could be provided on the ends of the base plate for attaching to mating connection means on the ends of the retention member.

The width and length of the base plate and retention member may also vary depending upon the size and strength of the spring member utilized.

Other variants are possible without departing from the scope of this invention.

What is claimed is:

1. A pre-loaded compression spring assembly comprising:
   (a) a conical compression spring having upper and lower ends; said spring comprising a coiled wire;
   (b) a base plate supporting said lower end of said spring; wherein said base plate includes capture means;
   (c) a flexible retention member extending over said upper end of said spring and retaining said spring in a pre-loaded condition on said base plate; wherein said retention member comprises a strap including first and second ends; wherein said first and second ends include ears projecting outwardly therefrom; and wherein said ears are captured by said capture means;
   wherein said spring assembly is capable of being compresed to a height equal to the sum of the diameter of said wire plus the thickness of said retention member plus the thickness of said base plate when force is applied to said upper end of said spring.

2. A pre-loaded compression spring assembly in accordance with claim 1, wherein said base plate includes first and second ends and first and second capture means carried thereby.

3. A pre-loaded compression spring assembly in accordance with claim 2, wherein each said capture means comprises spaced-apart finger members.

4. A pre-loaded compression spring assembly in accordance with claim 1, wherein said retention member comprises a plastic strap.

5. A pre-loaded compression spring assembly in accordance with claim 1, wherein said spring comprises a helical spring.

6. A pre-loaded compression spring assembly in accordance with claim 1, wherein said base plate includes stop means for constraining said lower end of said spring laterally when said spring is compressed.

7. A pre-loaded compression spring assembly in accordance with calim 1, wherein said retention member includes engagement means adapted to engage said upper end of said spring.

8. A pre-loaded compression spring assembly comprising:
   (a) a conical compression spring having upper and lower ends; said spring comprising a coiled wire;
   (b) a flexible strap member having first and second ends extending over said upper end of said spring and retaining said spring in a pre-loaded condition;
   (c) a base plate for supporting said lower end of said spring; wherein said base plate includes capture means;
   wherein said ends of said strap member are captured by said capture menas; wherein said spring assembly is capable of being compressed to a height equal to the sum of the diameter of said wire plus the thickness of said strap member plus the thickness of said base plate when force is applied against said upper end thereof.

9. A pre-loaded compression spring assembly in accordance with claim 8, wherein said retention member comprises a plastic strap.

10. In circuit board testing apparatus of the type including first and second spaced-apart generally parallel plate members, wherein a circuit board to be tested is positionable on said first plate member and wherein test probes project toward said first plate member from said second plate member for operatively contacting said circuit board through apertures in said first plate member when vacuum is applied to the space between said plate members, the improvement comprising a pre-loaded compression spring assembly positioned between said first and second plate members, wherein said spring assembly comprises:

(a) a conical compression spring having upper and lower ends; said spring comprising a coiled wire;

(b) a flexible strap member having first and second ends extending over said upper end of said spring and retaining said spring in a pre-loaded condition;

(c) a base plate supporting said lower end of said spring; wherein said base plate includes capture means;

wherein said ends of said strap member are captured by said capture menas; wherein said spring assembly is capable of being compressed to a height equal to the sum of the diameter of said wire plus the thickness of said strap member plus the thickness of said base plate when said first and second plate members are drawn towards each other by said vacuum without penetration of either of said plate members by said spring assembly.

11. Circuit board testing apparatus in accordance with claim 10, wherein said spring assembly is secured to one of said plate members.

12. Circuit board testing apparatus in accordance with claim 11, wherein said spring assembly is secured to said plate member by means of adhesive.

* * * * *

UNITED STATES PATENT AND TRADEMARK OFFICE
CERTIFICATE OF CORRECTION

PATENT NO. : 4,870,353

DATED : September 26, 1989

INVENTOR(S) : Stephen J. Cook

It is certified that error appears in the above-identified patent and that said Letters Patent is hereby corrected as shown below:

Column 1, line 20, "posible" should read -- possible --;

Column 2, line 41, "fromt he" should read -- from the --;

Column 3, line 64, "fromo" should read -- from --;

Column 4, line 33, "betested" should read -- be tested --;

Column 6, line 68, "menas" should read --means--;

Column 8, line 8, "menas" should read --means--.

Signed and Sealed this

Twenty-sixth Day of February, 1991

Attest:

HARRY F. MANBECK, JR.

*Attesting Officer*  *Commissioner of Patents and Trademarks*